US005479685A

United States Patent [19]

Shimokata et al.

[11] Patent Number: 5,479,685

[45] Date of Patent: Jan. 2, 1996

[54] METHOD OF PRODUCING INK JET PRINT HEAD

[75] Inventors: Akihiro Shimokata; Yasuhisa Fujii; Hisayoshi Fujimoto, all of Kyoto, Japan

[73] Assignee: Rohm Co., Ltd., Japan

[21] Appl. No.: 206,759

[22] Filed: Mar. 7, 1994

[30] Foreign Application Priority Data

Mar. 16, 1993 [JP] Japan .................................... 5-055261

[51] Int. Cl.$^{6}$ .............................. H01L 41/22; B41J 2/045

[52] U.S. Cl. .......................................... 29/25.35; 29/890.1

[58] Field of Search .................................... 29/25.35, 412, 29/416, 469, 890.1; 310/367, 369; 346/139 R, 140.1, 141

[56] References Cited

U.S. PATENT DOCUMENTS 5,193,256 3/1993 Ochiai et al. ...................... 29/890.1 X
5,265,315 11/1993 Hoisington et al. ................... 29/25.35

FOREIGN PATENT DOCUMENTS 4312852 11/1992 Japan .................................... 29/890.1
542672 2/1993 Japan .................................... 29/890.1
564889 3/1993 Japan .................................... 29/890.1
564893 3/1993 Japan .................................... 29/890.1

OTHER PUBLICATIONS

Gardner "Process For Fabrication of Ink Jet Orifices" Xerox Disclosure Journal vol. 4, No. 2, Mar./Apr. 1979, pp. 251–252.

*Primary Examiner*—Peter Vo
*Attorney, Agent, or Firm*—Bacon & Thomas

[57] ABSTRACT

A method of producing an ink jet print head includes the steps of forming separate ink paths with a predetermined pattern on a head base; fixing a vibration plate to a separate ink path side of the head base; temporarily fixing a piezoelectric element to a dummy substrate; patterning the piezoelectric element in accordance with the pattern of the separate ink paths of the head base to form separate piezoelectric elements: sticking a piezoelectric element side of the dummy substrate to the vibration plate so that the separate piezoelctric elements on the dummy substrate respectively correspond to the separate ink paths of the head base; and removing the dummy substrate.

4 Claims, 7 Drawing Sheets

METHOD OF PRODUCING INK JET PRINT HEAD

BACKGROUND OF THE INVENTION

The present invention relates to a method of producing an ink jet print head using a piezoelectric element as a driving source for ink exhaustion.

There has been a piezoelectric type ink jet print head using an piezoelectric element as a driving source for ink exhaustion. The print head generally includes a head base on which a plurality of separate ink paths are formed, a vibration plate fixed to the head base so as to cover all the separate ink paths, and piezoelectric elements adhering to portions of the vibration plate confronting the separate ink paths. An electric field is applied to the piezoelectric elements to deform the piezoelectric elements and further to deform the corresponding portions of the vibration plate, so that ink in the separate ink paths is pushed out of tip ports (nozzles) of the separate ink paths.

In order to mount piezoelectric elements in high density, there has been also presented a print head, for example, as shown in FIG. 10. In this print head, a plurality of (48 pieces in this example) separate ink paths 21 with a circular pattern extending from a group of nozzles at the center are formed on a head base 20, and a common ink path 22 for supplying ink to the separate ink paths 21 is formed around the separate ink paths 21. A vibration plate (not shown in FIG. 10) is fixed to the head base 20 so as to shut the separate ink paths 21 and the common ink path 22 tightly, and piezoelectric elements (not shown) each worked into a chip of a predetermined size are sticked to predetermined portions (shown by slanted lines) of the vibration plate one by one. Alignment marks 24 used at sticking the piezoelectric elements are provided at three positions on the head base 20.

However, in order to increase printing performance in the above described print head, it is required that the respective piezoelectric elements are precisely positioned to the predetermined portions of the vibration plate, that is, to the portions corresponding to the separate ink paths of the head base. However, in a case where piezoelectric elements are sticked one by one as in the above production method, it is difficult to make accurate positioning to the predetermined portions. If the sticked positions of the piezoelectric elements are off the predetermined portions, a pressure due to displacement of the piezoelectric element is not accurately applied to the corresponding portion of the vibration plate, so that printing becomes unstable and printing quality degrades.

Further, in the above production method., the piezoelectric elements are worked and sticked one by one, so that in case of the print head as shown in FIG. 10, there are required many mimes (48 times) of working and sticking of the piezoelectric elements. Thus, as the number of nozzles becomes large, a step from working to sticking becomes troublesome, a production time becomes long, and it becomes difficult to realize mass production. Especially, in order to improve printing performance, positioning precision of each piezoelectric element is important. However, in the case where piezoelectric elements are sticked one by one, high repetition precision for the number of the piezoelectric elements are required, which becomes a great barrier for mass production.

SUMMARY OF THE INVENTION

In view of the above, an object of the present invention is therefore to provide a method of producing an ink jet print head in which printing becomes stable, printing quality becomes improved, and a process time from working of piezoelectric elements to sticking thereof is shortened.

In order to achieve the above object, a method of producing an ink jet print head according to the present invention comprises the steps of forming separate ink paths with a predetermined pattern on a head base, fixing a vibration plate to a separate ink path side of the head base, temporarily fixing a piezoelectric element to a dummy substrate, patterning the piezoelectric element in accordance with the pattern of the separate ink paths of the head base to form patterned separate piezoelectric elements, sticking a piezoelectric element side of the dummy substrate to the vibration plate so that the separate piezoelectric elements of the dummy substrate respectively correspond to the separate ink paths of the head base, and then removing the dummy substrate.

According to the method of the present invention, since a piece of piezoelectric element temporarily fixed to the dummy substrate is patterned in accordance with the pattern of the separate ink paths to make the patterned separate piezoelectric elements, a predetermined number of and size of piezoelectric elements can be formed at the same time. On the other hand, a predetermined number of and pattern of separate ink paths are formed on the head base, and the vibration plate is fixed to the separate ink path side of the head base. After, for example, an adhesive is coated on the vibration plate of the head base, the dummy substrate is sticked to the vibration plate so that the separate piezoelectric elements on the dummy base are respectively positioned on the separate ink paths, and then the dummy substrate is removed.

As described above, a plurality of piezoelectric elements are formed at the same time by patterning and they are fixed to the vibration plate by one sticking step, so that the respective piezoelectric elements can be precisely positioned on the predetermined portions of the vibration plate, that is, on the portions corresponding to the separate ink paths of the head base. As a result, a pressure due to deformation of the piezoelectric element is precisely applied to the predetermined portion of the vibration plate, so that printing speed to print papers becomes stable, printing becomes stable, and further printing quality is improved. Further, a step from working of piezoelectric element to sticking thereof becomes simple and a production time can be shortened.

In order to more precisely and easily perform positioning at sticking of the piezoelectric elements to the head base (that is, vibration plate), when the piezoelectric element is patterned, it is preferable to provide alignment marks on the dummy substrate corresponding to alignment marks on the head base side at the same time.

Further, as described in the following embodiments, in order to certainly stick the piezoelectric elements to the vibration plate at the sticking of the piezoelectric elements, when the piezoelectric element is patterned, it is preferable to make not only a cut in the piezoelectric element but also half a cut in the dummy substrate, and to use the half cut portion of the dummy substrate as an escape portion for an adhesive used at sticking.

DETAILED DESCRIPTION OF THE PREFERRED EMBODIMENTS

Preferred embodiments of a production method according to the present invention will be described. In the following description, a print head with the structure shown in FIG. 10 will be used as an example.

Figure 1A:
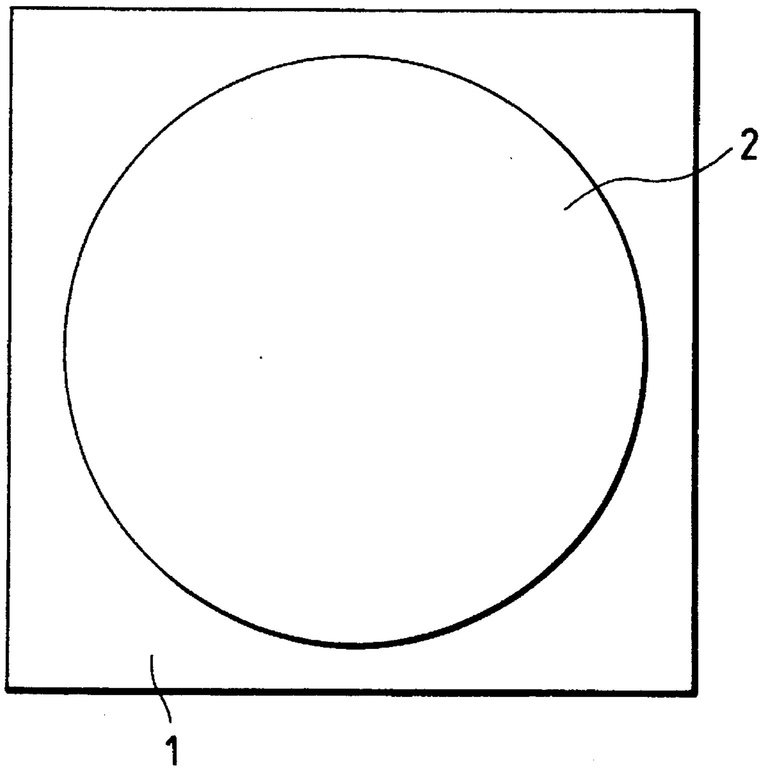
FIGS. 1(*a*) and 1(*b*) are views showing a first step of a production method according to the present invention, FIGS. 2 (*a*) and 2(*b*) are views showing a second step subsequent to the first step shown in FIG. 1.
Figure 1B:
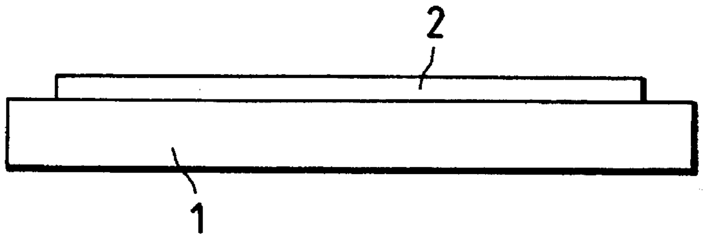

FIG. 1 is a view showing a first step of a production method of the present invention. As shown in FIG. 1 (FIG. 1(*a*) is a top view and FIG. 1(*b*) is a side view), a piece of disc-like piezoelectric element 2 is temporarily fixed to a dummy substrate 1 by an adhesive (wax etc.), the adhesion strength of which is lowered by action of heat solvent ultraviolet ray or the like.

Figure 2A:
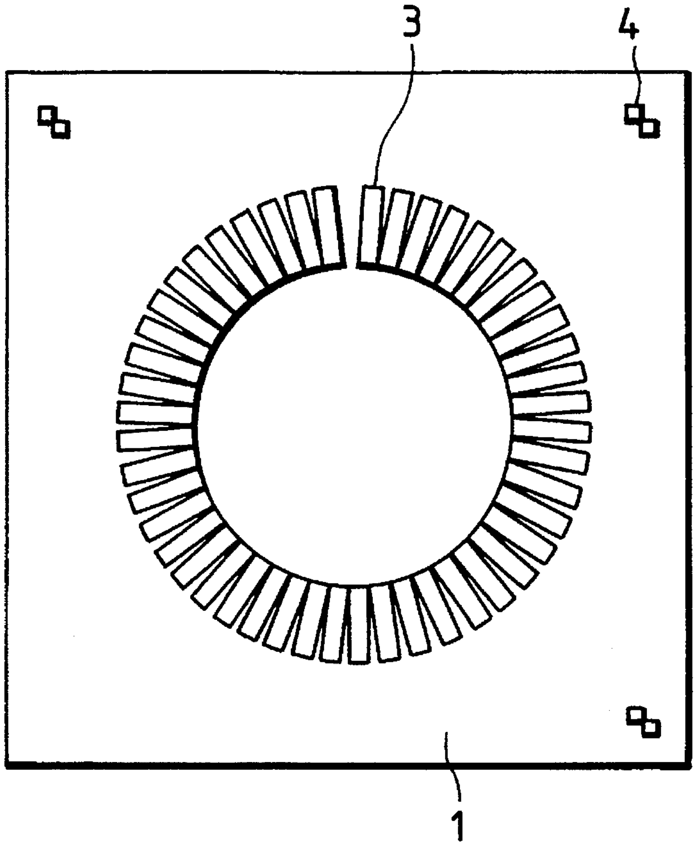
Figure 2B:
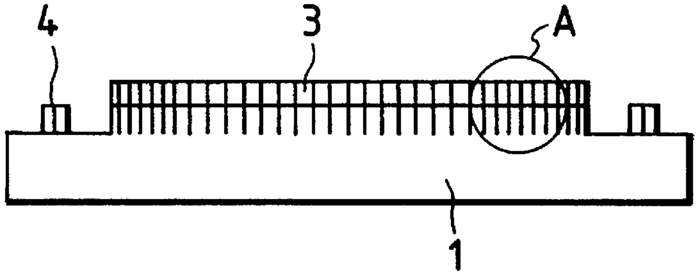
Figure 6:
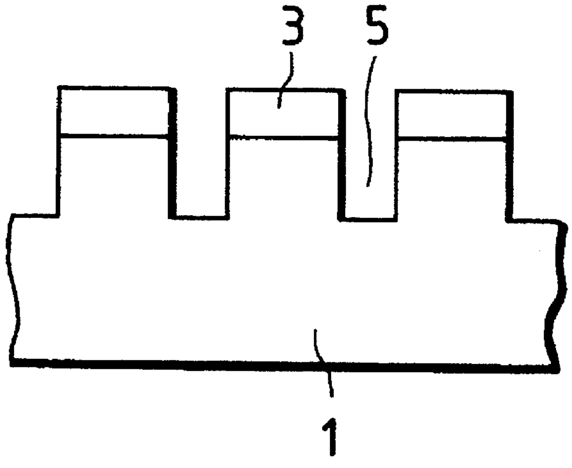
FIG. 6 is a partial enlarged view showing a circle portion shown in FIG. 2(*b*)

Next, in FIG. 2 (FIG. 2(*a*) is a top view and FIG. 2(*b*) is a side view), the piezoelectric element 2 is patterned to form a plurality of (48 pieces) piezoelectric elements 3 arranged in a circle, and alignment marks 4 used at sticking the piezoelectric elements are formed at three positions on the dummy substrate 1. The shape, size and position of the piezoelectric elements 3 correspond to separate ink paths formed on the head base. Further, in this embodiment, as is understood from FIG. 6 which is an enlarged view showing a circular portion A of FIG. 2(*a*), not only a cut in the piezoelectric elements 3 but also half a cut in the dummy substrate 1 are made. The half cue portion 5 of the dummy substrate 1 becomes an escape portion for an adhesive described below.

A method of patterning the piezoelectric element temporarily fixed to the dummy substrate will be described in detail with reference to FIGS. 11(*a*) to 11(*d*).

After the piezoelectric element 2 is temporarily fixed to the dummy substrate 1 through wax as shown in FIG. 11(*a*), a dry film 30 is laminated on the piezoelectric element 2 as shown in FIG. 11(*b*). Next, the dry film is patterned through light exposure and development into a predetermined pattern, and parts without the dry film are selectively worked and removed through sand blast as shown in FIG. 11(*c*). Finally, the dry film pattern is peeled off so that a predetermined pattern of the piezoelectric element is formed as shown in FIG. 11(*d*).

Figure 3:
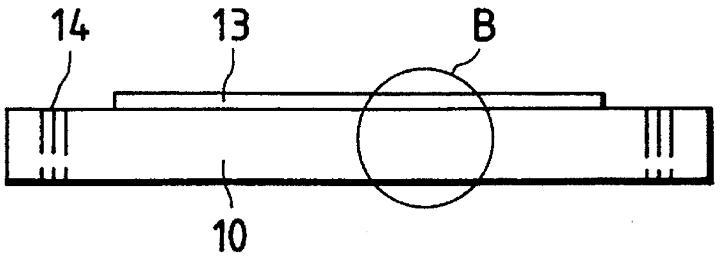
FIG. 3 is a view showing a third step subsequent to the second step shown in FIG. 2.
Figure 7:
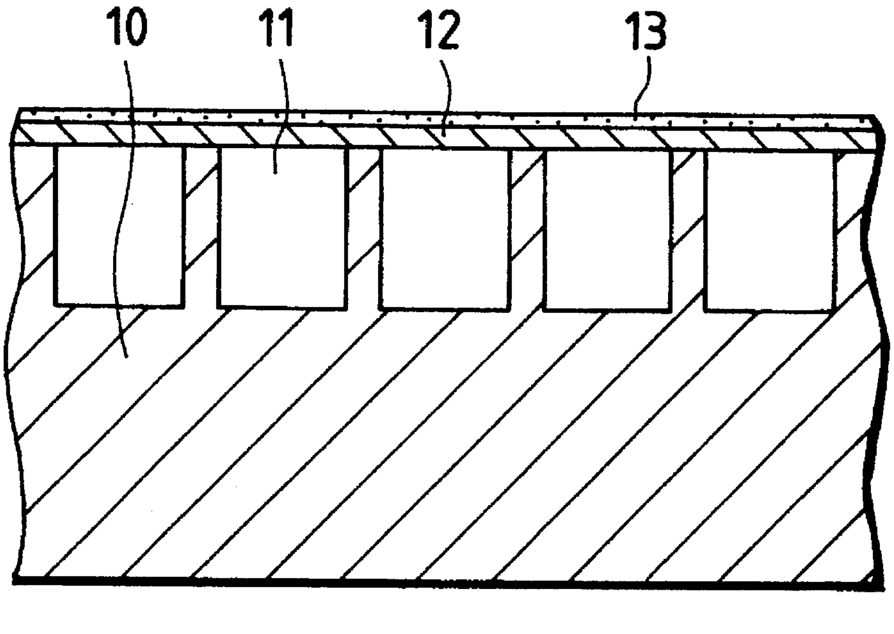
FIG. 7 is a partial enlarged view showing a circle portion shown in FIG. 3.
Figure 10:
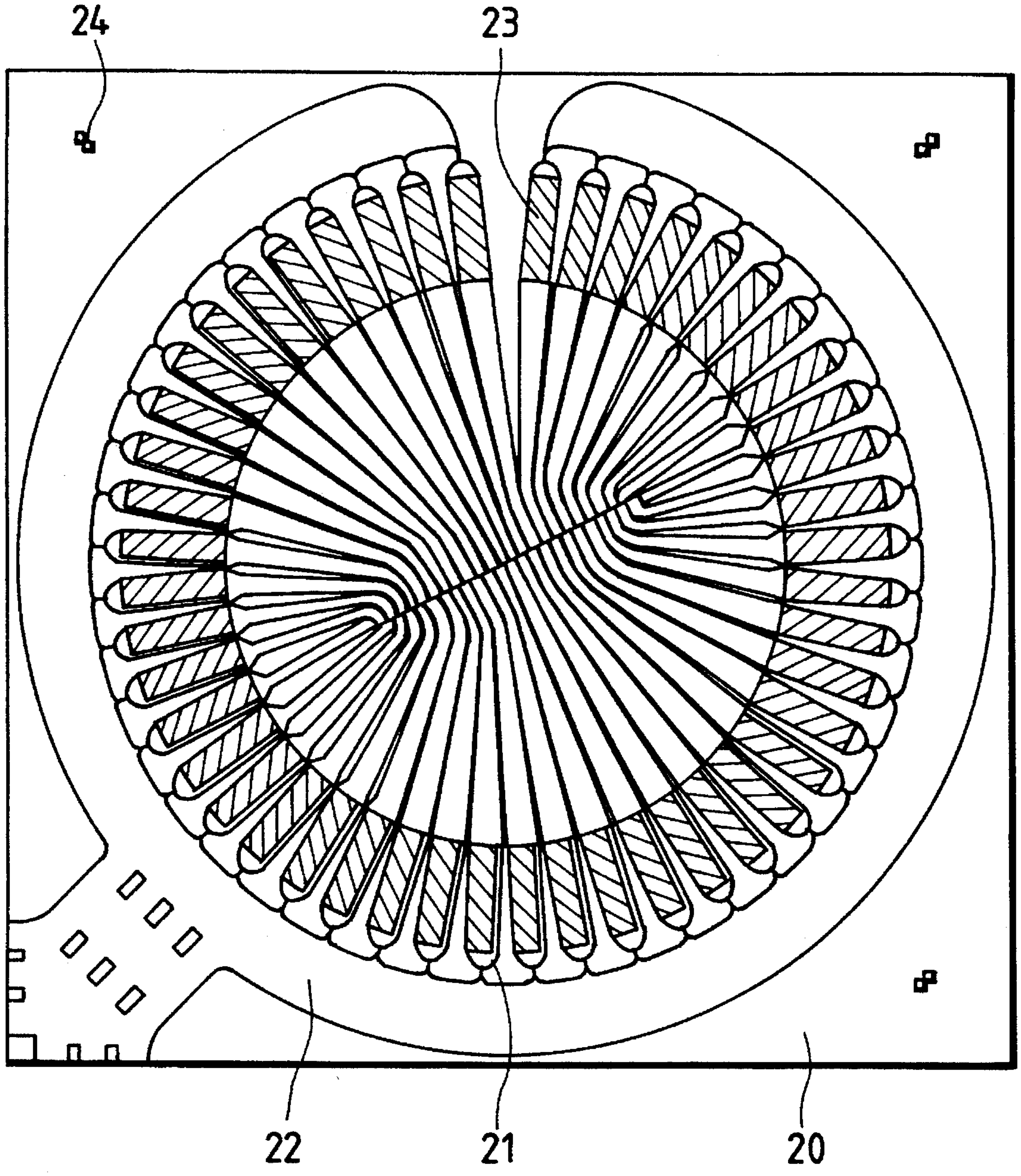
FIG. 10 PRIOR ART
FIG. 10 is a plan view showing a conventional ink jet print head, and FIGS. 11(*a*) to 11(*d*) are views showing steps of patterning a piezoelectric element temporarily fixed to a dummy substrate.
Figure 11A:
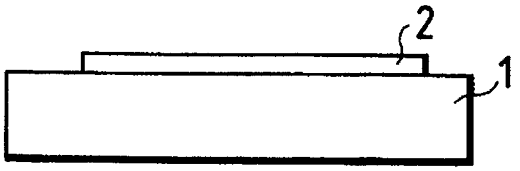
Figure 11B:
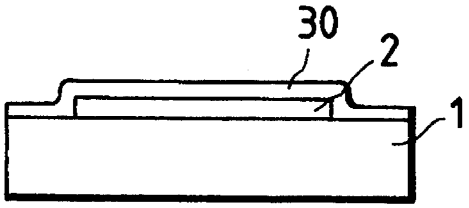
Figure 11C:
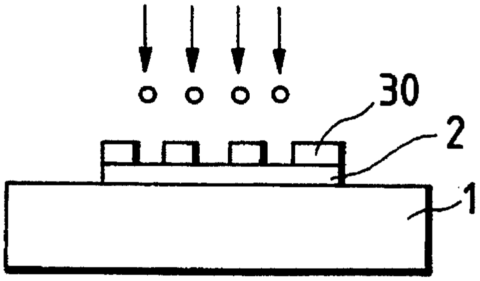
Figure 11D:
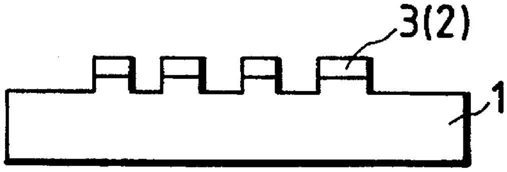

On the other hand, as shown in FIG. 3 and FIG. 7 which is an enlarged view showing a circular portion B of FIG. 3, a plurality of (48 pieces) separate ink paths 11 with a pattern as shown in FIG. 10 and a common ink path (not shown) are formed on the head base 10, and alignment marks 14 used at sticking piezoelectric elements are formed. After a vibration plate 12 is fixed to the head base to shut the separate ink paths 11 and the common ink path tightly, an adhesive 13 for sticking the piezoelectric elements 3 is coated on the vibration plate 12.

Figure 4:
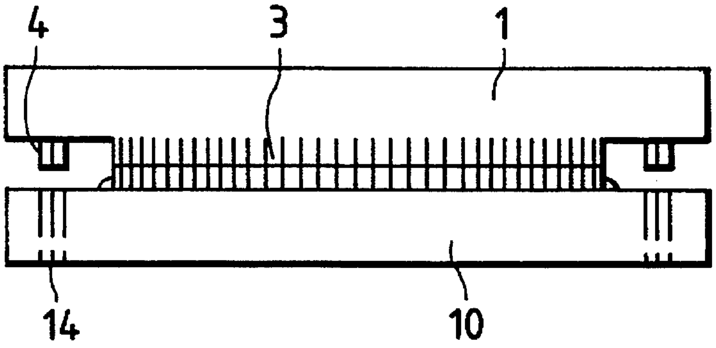
FIG. 4 is a view showing a fourth step subsequent to the third step shown in FIG. 3.
Figure 5:
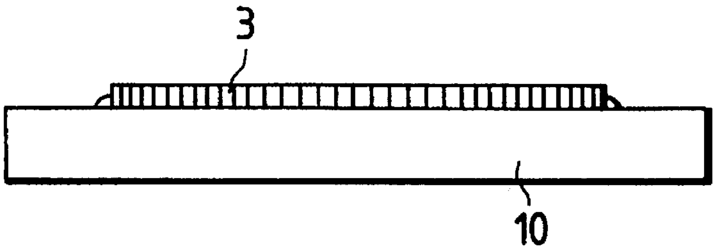
FIG. 5 is a view showing a fifth step subsequent to the fourth step shown in FIG. 4.

Subsequently, the alignment marks on the head base 10 and the alignment marks 4 on the dummy substrate 1 are positioned to each other, and the piezoelectric elements 3 are sticked to the head base 10 (vibration plate 12) by the adhesive (see FIG. 4). Thus, the respective piezoelectric elements 3 are fixed to portions of the vibration plate 12 corresponding to the separate ink paths 11. Then, the dummy substrate 1 on which the piezoelectric elements 3 are temporarily fixed is removed by using heat, solvent, ultraviolet ray or the like (see FIG. 5), whereby the ink jet print head as shown in FIG. 10 is obtained.

Figure 8:
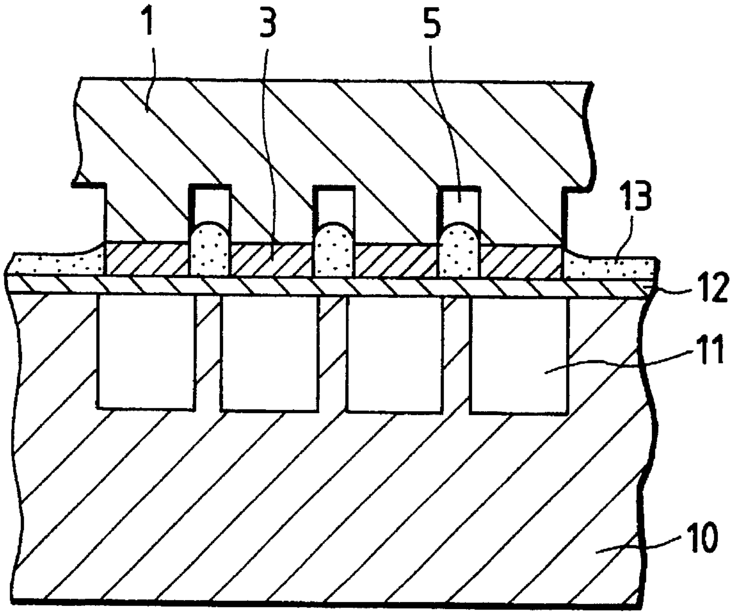
FIG. 8 is a partial enlarged sectional view showing details of a main part of the step shown in FIG. 4.
Figure 9:
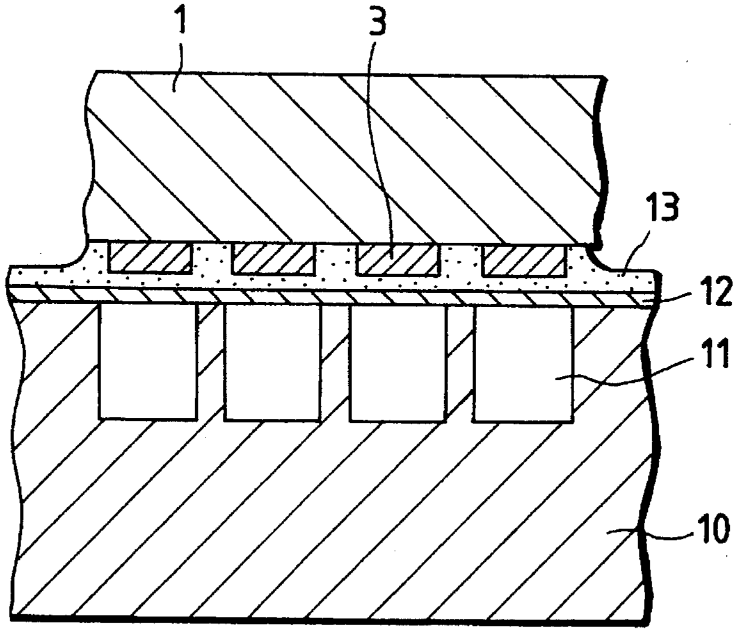
FIG. 9 is a partial enlarged sectional view showing details of a main part of other example in the step shown in FIG. 4.

In the case where the half cut portion 5 is provided in the dummy substrate 1, when the piezoelectric elements 3 are sticked to the vibration plate 12 by the adhesive, the adhesive 13 escapes into the half cut portion 5 as shown in FIG. 8, so that the adhesive 13 does not intervene between the piezoelectric elements 3 and the vibration plate 12, and the piezoelectric elements 3 is certainly sticked to the vibration plate 12. On the contrary, if the half cut portion is not provided, because of a rise of the adhesive 13, the adhesive intervenes between the piezoelectric elements 3 and the vibration plate 12, so that sticking of the both is not certainly conducted. Thus, it is preferable to make half a cut in the dummy substrate 1 when the piezoelectric element 2 temporarily fixed to the dummy substrate 1 is patterned.

In the thus prepared print head, when an electric field is applied to an arbitrary piezoelectric element 3, the piezoelectric element 3 deforms. Due to this deformation, the confronting portion of the vibration plate 12 also deforms so that an ink volume of the separate ink path 11 increases or decreases. When the ink volume begins to decrease, ink in the separate ink path is exhausted from a nozzle to perform printing.

The structure of the print head in the above embodiment is merely an example. It is needless to say that the production method of the present invention is not restricted to the structure. For example, although the separate ink paths and piezoelectric elements are arranged in a circle in the above embodiment, the present invention is also applicable to a case where they are arranged in a straight. The piezoelectric elements may be patterned in accordance with an arbitrary arrangement pattern.

As described above, in the production method of the present invention, the piezoelectric elements temporarily fixed to the dummy substrate is finely divided into predetermined shape and size of pieces by patterning, they are sticked to the vibration plate of the head base on which the separate ink paths are formed, and then the dummy substrate is removed.

According to this method, the respective piezoelectric elements are precisely positioned at predetermined portions of the vibration plate, so that a pressure due to deformation of the piezoelectric element is accurately applied to the predetermined portion of the vibration plate. Thus, printing speed to printing papers becomes stable, and stability of printing and improvement of printing quality can be realized. Further, since it is not necessary to stick the piezoelectric elements one by one, a processing time from working of the piezoelectric elements to sticking thereof can be shortened, and mass production becomes possible.

What is claimed is:

1. A method of producing an ink jet print head, comprising the steps of:

forming separate ink paths with a predetermined pattern on a head base;

fixing a vibration plate to a side of said head base having separate ink paths formed thereon;

temporarily fixing a piezoelectric element to a side of a dummy substrate;

patterning said piezoelectric element in accordance with said pattern of said separate ink paths of said head base to form separate piezoelectric elements;

sticking said piezoelectric elements temporarily fixed to the side of said dummy substrate to said vibration plate so that said separate piezoelectric elements respectively correspond to said separate ink paths of said head base; and removing said dummy substrate from said vibration plate, whereby said separate piezoelectric elements remain on said vibration plate and are positioned relative to the ink paths to form an ink jet head without the need to stick the separate piezoelectric elements one by one on the vibration plate.

2. A method of producing an ink jet print head as claimed in claim 1, wherein the step of patterning said piezoelectric element comprises a step of making a half cut in said dummy substrate in addition to making a cut in said piezoelectric element, a portion half cut in said dummy substrate being an escape portion for an adhesive used in sticking said separate piezoelectric elements.

3. A method of producing an ink jet print head as claimed in claim 1, wherein the step of patterning said piezoelectric element comprises a step of providing alignment marks on said dummy substrate corresponding to alignment marks on said head base.

4. A method of producing an ink jet print head as claimed in claim 3, wherein the step of patterning said piezoelectric element comprises a step of making a half cut in said dummy substrate in addition to making a cut in said piezoelectric element, a portion half cut in said dummy substrate being an escape portion for an adhesive used in sticking said separate piezoelectric elements.

* * * * *